(12) United States Patent
Hiramoto et al.

(10) Patent No.: US 8,901,686 B2
(45) Date of Patent: Dec. 2, 2014

(54) MOUNTING STRUCTURE OF CHIP TYPE ELECTRIC ELEMENT AND ELECTRIC APPARATUS HAVING CHIP TYPE ELECTRIC ELEMENT ON FLEXIBLE BOARD

(75) Inventors: Satoru Hiramoto, Chita (JP); Koichiro Matsumoto, Kyoto (JP); Yoshiyuki Kono, Obu (JP); Akitoshi Mizutani, Okazaki (JP)

(73) Assignee: Denso Corporation, Kariya (JP)

( * ) Notice: Subject to any disclaimer, the term of this patent is extended or adjusted under 35 U.S.C. 154(b) by 521 days.

(21) Appl. No.: 13/303,337

(22) Filed: Nov. 23, 2011

(65) Prior Publication Data

US 2012/0153415 A1  Jun. 21, 2012

(30) Foreign Application Priority Data

Dec. 20, 2010 (JP) ................. 2010-282544

(51) Int. Cl.
*H01L 29/82* (2006.01)
*H05K 1/11* (2006.01)
*H05K 1/18* (2006.01)
*H05K 3/34* (2006.01)

(52) U.S. Cl.
CPC ............... *H05K 1/111* (2013.01); *H05K 1/189* (2013.01); *H05K 3/3421* (2013.01); *H05K 3/3442* (2013.01); *H05K 2201/09418* (2013.01)
USPC ............ 257/421; 257/422; 257/427; 257/428

(58) Field of Classification Search
USPC .................. 257/421, 422, 427, 428
See application file for complete search history.

(56) References Cited

U.S. PATENT DOCUMENTS

2009/0077800 A1* 3/2009 Randall et al. ............ 29/854
2011/0234218 A1* 9/2011 Lagouge .................. 324/247

FOREIGN PATENT DOCUMENTS

| JP | 6069625 | | 3/1994 |
|---|---|---|---|
| JP | 06-050382 | U | 8/1994 |
| JP | 8139437 | | 5/1996 |
| JP | 09-283889 | * | 10/1997 |
| JP | 09-283889 | A | 10/1997 |
| JP | 10-223997 | A | 8/1998 |
| JP | 10-293006 | A | 11/1998 |

OTHER PUBLICATIONS

Office Action issued Dec. 18, 2012 in corresponding Japanese Application No. 2010-282544 with English translation.

* cited by examiner

*Primary Examiner* — Tan N Tran

(57) ABSTRACT

A mounting structure for mounting a chip type electric element on a flexible board includes: the flexible board having a first land, on which a first lead terminal of another electric element is soldered; and the chip type electric element having a long side. A whole of the long side of the chip type electric element faces a long side of the first land. A length of the long side of the first land is defined as IA, and a distance between one long side of the first land and one long side of the chip type electric element is defined as IB, the one long side of the first land facing the chip type electric element but opposite to the one long side of the chip type electric element. The length of IA is equal to or larger than the distance of IB.

8 Claims, 4 Drawing Sheets

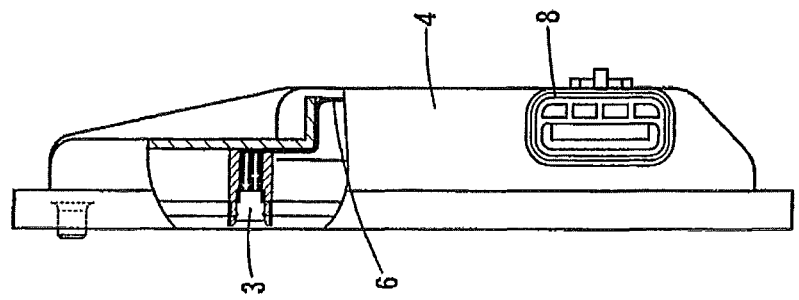
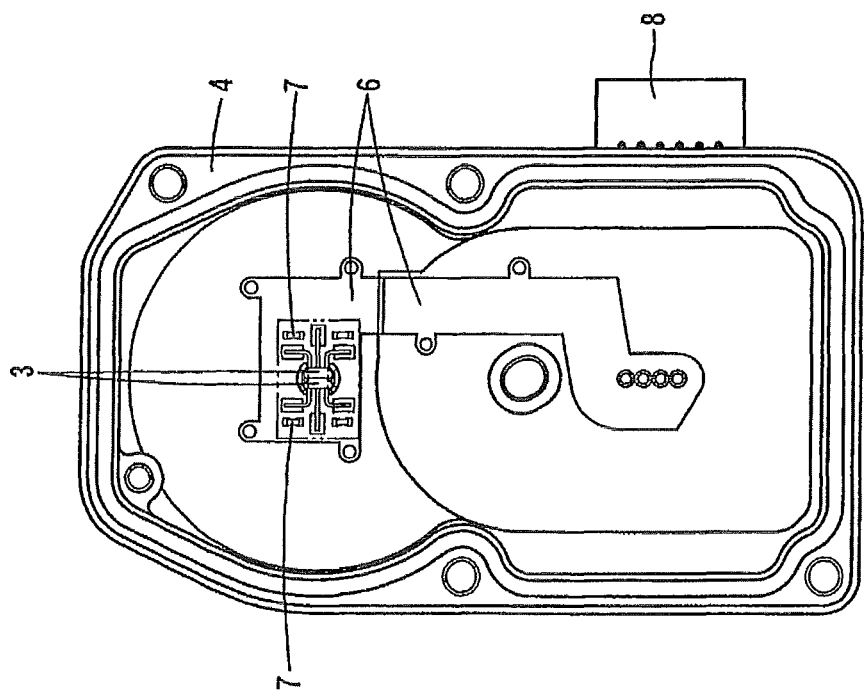

MOUNTING STRUCTURE OF CHIP TYPE ELECTRIC ELEMENT AND ELECTRIC APPARATUS HAVING CHIP TYPE ELECTRIC ELEMENT ON FLEXIBLE BOARD

CROSS REFERENCE TO RELATED APPLICATION

This application is based on Japanese Patent Application No. 2010-282544 filed on Dec. 20, 2010, the disclosure of which is incorporated herein by reference.

TECHNICAL FIELD

The present invention relates to a mounting structure of a chip type electric element mounted on a flexible board and an electric apparatus having a chip type electric element on a flexible board.

BACKGROUND

Conventionally, a mounting structure of a ceramic capacitor is disclosed in JP-A-H06-69625.

When the ceramic capacitor is directly soldered on a printed circuit board or an aluminum board, the ceramic capacitor may be broken by application of large thermal stress since a thermal expansion coefficient of the ceramic capacitor is largely different from the board. In view of this difficulty, in JP-A-H06-69625, as shown in FIG. 4, an opening 101 is formed in the flexible board 100. Further, the ceramic capacitor 110 is soldered on the board 100 so as to bridge the opening 101. The flexible board 100 is mounted on an aluminum board 120 or a printed wiring board.

As shown in FIGS. 5A and 5B, JP-A-H08-139437 teaches that a protection member 220 made of insulation material is mounted on a surface of a flexible board 200 so that an element soldered on the flexible board 200 is protected. The protection member 220 has, for example, a square frame shape, which surrounds a periphery of the element 210. The protection member 220 has appropriate rigidity. When the protection member 220 is mounted on the flexible board 200, rigidity of a part of the flexible board 200 covered with the protection member 220 increases. Thus, the flexible board 200 does not easily bend. Accordingly, as shown in FIG. 5B, when a roller 230 is displaced on the surface of the flexible board 200, the part of the flexible board 200 surrounded with the protection member 220 is prevented from bending. Thus, unnecessary peeling-off force is not applied to both sides 241, 242 of the part of the flexible board 200, on which the element 210 and a solder portion 240 are mounted. Accordingly, the element 210 and the solder portion 240 are protected.

However, in the mounting method described in JP-A-H06-69625, since it is necessary to mount the flexible board 100 on the aluminum board 120 or the printed circuit board, and the ceramic capacitor 110 is soldered on the flexible board 100. A cost for manufacturing the aluminum board 120 and the printed circuit board is additionally necessary. Further, the aluminum board 120 or the printed circuit board, on which the flexible board 100 is mounted, has dimensions larger than the flexible board 100. Accordingly, dimensions of a mounting structure for protecting the ceramic capacitor increases, and therefore, it is not suitable for mounting the ceramic capacitor 110.

In a technique described in JP-A-H08-139437, a cost for manufacturing the protection member 220 is additionally necessary. Further, since the protection member 220 surrounds the periphery of the element 210, which is mounted on the flexible board 200, it is necessary to avoid interference between the protection member 220 and other elements mounted on the board 200. Thus, it is difficult to secure a space for arranging the protection member 220.

SUMMARY

In view of the above-described problem, it is an object of the present disclosure to provide a mounting structure of a chip type electric element mounted on a flexible board. It is another object of the present disclosure to provide an electric apparatus having a chip type electric element on a flexible board. In the mounting structure and the electric apparatus, a stress applied to the chip type electric element with respect to a distortion of the flexible board is reduced. Further, a manufacturing cost of the mounting structure and the electric apparatus does not increase largely.

According to an aspect of the present disclosure, a mounting structure for mounting a chip type electric element on a surface of a flexible board includes: the flexible board having a first land, on which a first lead terminal of another electric element is soldered; and the chip type electric element having a long side. A whole of the long side of the chip type electric element faces a long side of the first land. A length of the long side of the first land is defined as IA, and a distance between one long side of the first land and one long side of the chip type electric element is defined as IB, the one long side of the first land facing the chip type electric element but opposite to the one long side of the chip type electric element. The length of IA is equal to or larger than the distance of IB.

In the above mounting structure, since the load generated by the distortion of the board and applied to the chip type electric element is reduced, damage of the chip type electric element caused by the stress is reduced. Further, a manufacturing cost of the mounting structure does not increase largely.

According to a second aspect of the present disclosure, an electric apparatus includes: a flexible board having a first land and a second land; a chip type electric element having a long side and a short side and arranged on a surface of the flexible board; and an electric device having a first lead terminal and a second lead terminal and arranged on the surface of the flexible board. The first lead terminal is soldered on the first land, and the second lead terminal is soldered on the second land. A whole of the long side of the chip type electric element faces a long side of the first land. A length of the long side of the first land is defined as IA, and a distance between one long side of the first land and one long side of the chip type electric element is defined as IB, the one long side of the first land facing the chip type electric element but opposite to the one long side of the chip type electric element. The length IA is equal to or larger than the distance of IB. The long side of the first land is perpendicular to a long side of the second land. A whole of the short side of the chip type electric element faces the long side of the second land. A length of the long side of the second land is defined as IC, and a distance between one long side of the second land and one short side of the chip type electric element is defined as ID, the one long side of the second land facing the one short side of the chip type electric element. The length of IC is equal to or larger than the distance of ID.

In the above apparatus, since the load generated by the distortion of the board and applied to the chip type electric element and the solder portion is reduced, damage of the chip type electric element caused by the stress is reduced. Further, a manufacturing cost of the apparatus does not increase largely.

BRIEF DESCRIPTION OF THE DRAWINGS

The above and other objects, features and advantages of the present invention will become more apparent from the following detailed description made with reference to the accompanying drawings. In the drawings:

FIG. 2A is a diagram showing a plan view of an inside of a censor cover, in which the flexible board is arranged, and FIG. 2B is a diagram showing a side view of the censor cover;

DETAILED DESCRIPTION

First Embodiment

A mounting structure of a chip type electric element according to a first embodiment is applied to a throttle position sensor 1.

Figure 3:
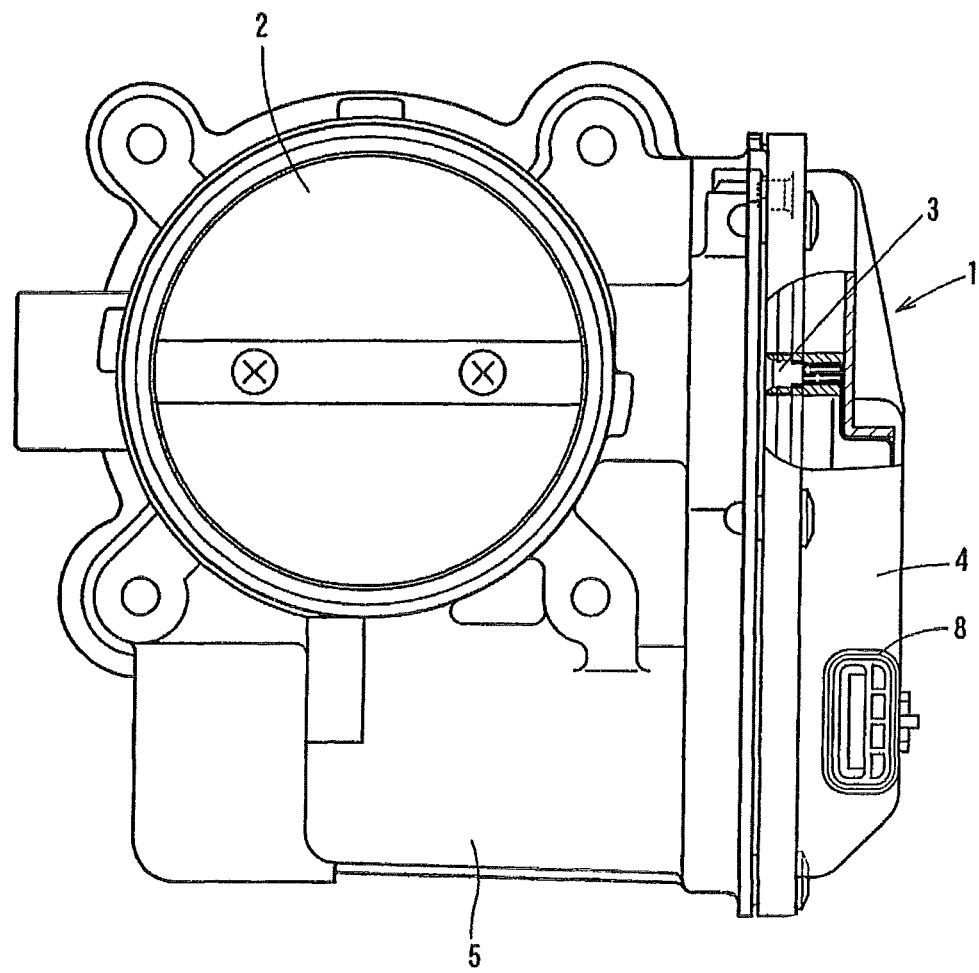
FIG. 3 is a diagram showing a side view of a throttle body.
Figure 4:
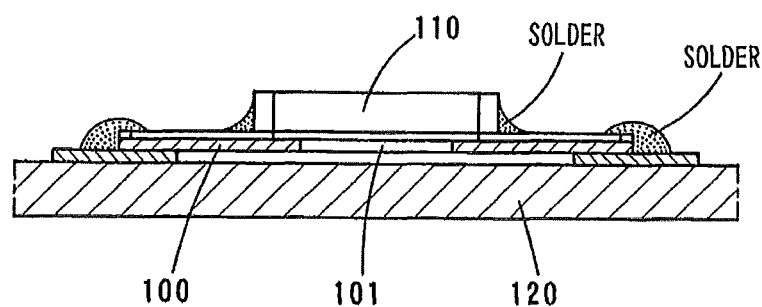
FIG. 4 is a diagram showing a cross sectional view of a mounting structure of a capacitor according to a prior art.
Figure 5A:
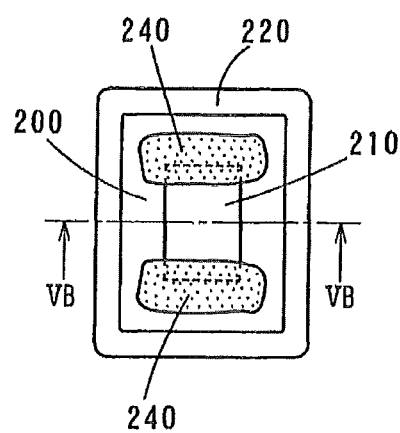
FIG. 5A is a diagram showing a plan view of a mounting structure.
Figure 5B:
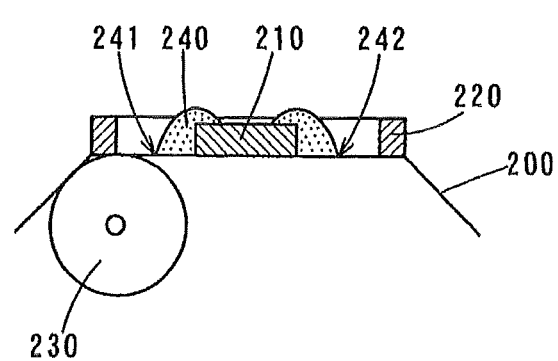
FIG. 5B is a diagram showing a cross sectional view of the mounting structure, according to the prior art.

The throttle position sensor 1 detects an opening degree of a throttle valve 2, as shown in FIG. 3. The throttle valve 2 adjusts an amount of suction air of an internal combustion engine. The sensor 1 includes a Hall IC 3 for amplifying and outputting a voltage as a Hall voltage, which corresponds to a magnetic flux density of a magnetic field. The Hall IC 3 is attached to a sensor cover 4 made of resin. The sensor cover 4 is fixed to a side of the throttle body 5, which accommodates the throttle valve 2.

The flexible board 6 is arranged on an inside of the sensor cover 4, as shown in FIG. 2A. Two Hall ICs 3 and four capacitors 7 are mounted on the flexible board 6. Further, a connector 8 is arranged on one side of the sensor cover 4, as shown in FIG. 2B. The connector 8 electrically connects to an ECU (not shown) as an external electric control unit.

The Hall IC 3 has three lead terminals, which are an input terminal 9, a ground terminal 10 and an output terminal 11. A control current flows into the Hall device (not shown) through the input terminal 9. The ground terminal 10 is connected to a ground potential. A voltage signal is output from the output terminal 11. Each lead terminal is soldered on a land arranged on the flexible board 6. Here, a land for soldering the input terminal 9 is defined as a first land 12, a land for soldering the ground terminal 10 is defined as a second land 13, and a land for soldering the output terminal 11 is defined as a third land 14.

Figure 1:
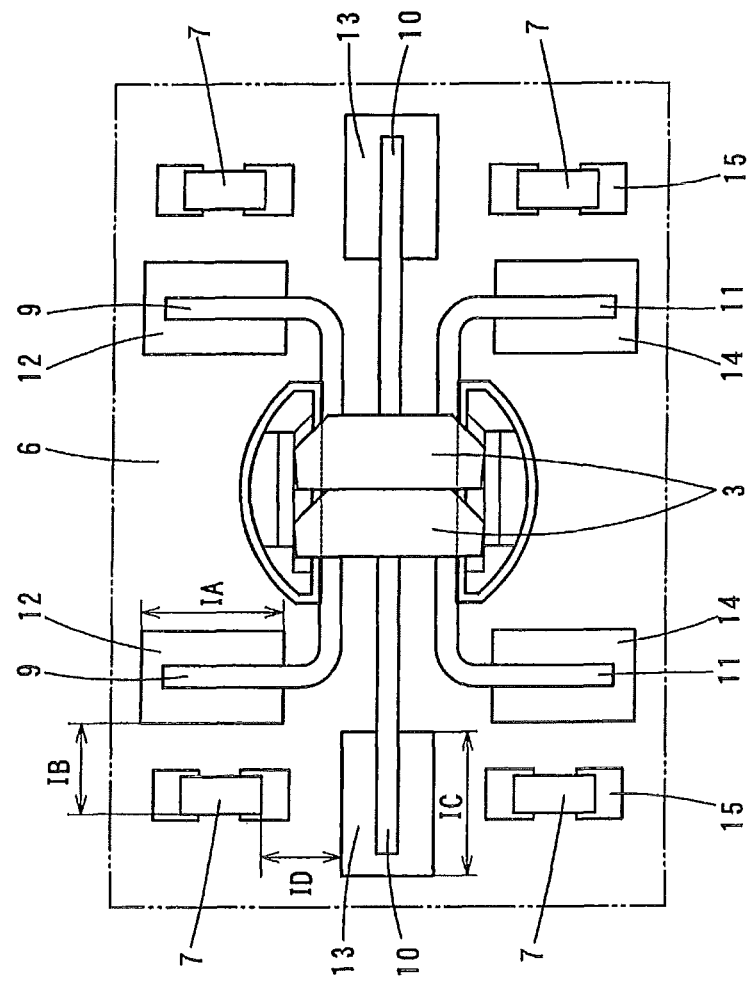
FIG. 1 is a diagram showing a plan view of a mounting structure of a capacitor on a flexible board.

As shown in FIG. 1, the ground terminal 10 of the Hall IC 3 is arranged between the input terminal 9 and the output terminal 11, i.e., arranged in the middle of three lead terminals. Further, the ground terminal 10 extends straight along with a direction retrieved from the Hall IC 3. The input terminal 9 and the output terminal 11 are retrieved along with the same direction as the ground terminal 10. Then, the input terminal 9 aid the output terminal 11 bend at middle portions thereof so that the input terminal 9 and the output terminal 11 extend to opposite directions. Thus, the input terminal 9 and the output terminal 11 bend by 90 degrees so that the input terminal 9 and the output terminal 11 are separated from the ground terminal 10.

The first to third lands 12-14 have a rectangular plan shape. Dimensions of each of the first to third lands 12-14 are same, so that the areas of the first to third lands 12-14 are same. Here, FIG. 1 shows a state of the mounting structure before the first to third lands 12-14 are soldered so that each lead terminal 9-11 is not soldered on the land 12-14.

The capacitor 7 is used as a noise filter for filtering an electro-magnetic noise applied to the Hall IC 3 through the lead terminals 9-11. The capacitor 7 is a chip type layered ceramic capacitor, in which multiple ceramic sheets with electrodes are stacked. As shown in FIG. 1, the capacitor 7 is soldered on the land 15 of the flexible board 6 so that the capacitor 7 is surface-mounted on the board 6.

The capacitor 7 is arranged in space formed between the first land 12 and the second land 13 and between the second land 13 and the third land 14. Specifically, the capacitor 7 is disposed between the input terminal 9 and the ground terminal 10 and between the ground terminal 10 and the output terminal 11.

The mounting structure of the capacitor 7 will be explained as follows with reference to FIG. 1.

Here, one of four capacitors 7 disposed on a left upper corner of the drawing of FIG. 1 is explained. Other capacitors 7 are mounted on the board 6 in the same manner.

The capacitor 7 is a chip type capacitor having the rectangular plan shape. A longitudinal direction of the capacitor 7 is in parallel to a longitudinal direction of the first land 12. Further, a whole side of the capacitor 7 along with the longitudinal direction faces a side of the first land along with the longitudinal direction so that the whole side of the capacitor 7 is arranged within the range of the longitudinal direction of the first land 12.

Further, a length of the first land 12 along with the longitudinal direction is defined as IA. A distance between a left side of the first land 12 and a lent side of the capacitor 7 is defined as TB in a horizontal direction of the board 6. Specifically, the left side of the first land 12 does not face the left side of the capacitor 7. In this case, a relationship is satisfied such that the length IA is equal to or larger than the distance IB.

In the throttle position sensor 1, the sensor cover 4, to which the flexible board 6 is attached, is made of resin. Further, the thickness of the sensor cover 4 is thin. Thus, for example, when thermal stress is applied to the sensor cover 4 so that the sensor cover 4 is distorted, the distortion of the flexible board 6 is generated.

However, in the mounting structure of the capacitor 7, since the capacitor 7 is arranged near the first land 12, unnecessary load applied to a solder portion of the capacitor 7 and unnecessary load applied to the capacitor 7 are restricted since the solder portion applied to the first land 12 has certain rigidity. Thus, even when the flexible board 6 is distorted, the load to the capacitor and the solder portion are reduced. Thus, the stress applied to the capacitor 7 and the solder portion is reduced. As a result, a crack and the like are not generated in the capacitor 7 and the solder portion. The damage of the capacitor 7 and the solder portion is reduced.

Since the capacitor 7 is a chip type multi-layered ceramic capacitor, and has the rectangular plan shape mounted on the flexible board 6, the long side of the capacitor 7, which is weaker than the short side of the capacitor 7 when the stress is applied, is arranged in parallel to the longitudinal direction of the first land 12. Thus, the stress caused by the distortion of the flexible board 6 and applied to the capacitor 7 is effectively restricted.

Further, in the mounting structure of the capacitor 7 according to the present embodiment, it is not necessary to use the aluminum board, the printed circuit board and the protection member for the protection of the capacitor 7. Accordingly, a manufacturing cost of the mounting structure does not additionally increase.

Further, in JP-A-H06-69625, since the aluminum board or the printed circuit board having the dimensions larger than the flexible board for mounting the ceramic capacitor is used, it is difficult to use the mounting method of the capacitor according to JP-A-H06-69625. However, in the present embodiment, since it is not necessary to attach the flexible board 6 to the aluminum board and the printed circuit board, space for forming the mounting structure of the capacitor 7 can be minimized. Thus, the mounting structure according to the present embodiment is easily used for various products. Further, in JP-A-H08-139437, since the protection member surrounds a periphery of the electric elements, it is necessary to find the space for accommodating the protection member. However, in the present embodiment, it is not necessary to surround the periphery of the capacitor 7 with the protection member. Instead, since the capacitor 7 is arranged near the first land 12 to conserve space, the space for the mounting structure of the capacitor 7 is reduced.

Second Embodiment

In the first embodiment, the positional relationship between the first land 12 and the capacitor 7 is specified. In the present embodiment, the positional relationship between the second land 13 and the capacitor 7 in addition to the positional relationship between the first land 12 and the capacitor 7 is specified.

As shown in FIG. 1, the short side of the capacitor 7 is arranged in parallel to the longitudinal direction of the second land 13. Further, the short side of the capacitor 7 is arranged within the long side of the second land 13 so that a whole of the short side of the capacitor 7 faces the long side of the second land 13. Further, the length of the long side of the second land 13 is defined as IC. In FIG. 1, the length IC of the second land 13 is equal to the length IA of the long side of the first land 12. The distance between one long side of the second land 13 and one short side of the capacitor 7 is defined as ID, and the one long side of the second land 13 faces the one short side of the capacitor 7. In this case, the relationship between the distance ID and the length IC is such that the length IC is equal to or larger than the distance ID.

In the present embodiment, the rigidity of the solder portion applied to the second land 13 in addition to the rigidity of the solder portion applied to the first land 12 is used for protecting the capacitor 7. Thus, even when the flexible board 6 is distorted, the damage of the capacitor 7 and the solder portion is effectively reduced.

Modifications

In the above embodiments, the mounting structure of the chip type electric element is used for the throttle position sensor 1. Alternatively, the mounting structure of the chip type electric element may be used for an acceleration pedal opening degree sensor for detecting an opening degree of an acceleration pedal, a EGR valve opening degree sensor for detecting an opening degree of a EGR valve, or the like. Further, in the above embodiments, the chip type electric element is the capacitor 7. Alternatively, the chip type electric element may be a chip type resistor, a chip type inductor or the like.

The above disclosure has the following aspects.

According to an aspect of the present disclosure, a mounting structure for mounting a chip type electric element on a surface of a flexible board includes: the flexible board having a first land, on which a first lead terminal of another electric element is soldered; and the chip type electric element having a long side. A whole of the long side of the chip type electric element faces a long side of the first land. A length of the long side of the first land is defined as IA, and a distance between one long side of the first land and one long side of the chip type electric element is defined as IB, the one long side of the first land facing the chip type electric element but opposite to the one long side of the chip type electric element. The length of IA is equal to or larger than the distance of IB.

In the above mounting structure, with using the rigidity of a solder portion applied to the land, unnecessary load is restricted from being applied to the chip type electric element and the solder portion. Thus, even when a distortion is generated in the flexible board, the distortion of the board does not affect on the chip type electric element and the solder portion or influence of the distortion of the board to the chip type electric element and the solder portion is reduced. Thus, since the load generated by the distortion of the board and applied to the chip type electric element and the solder portion is reduced, damage of the chip type electric element caused by the stress is reduced. Further, since the positional relationship between the land and the chip type electric element is specified so that the load generated by the distortion of the board and applied to the chip type electric element and the solder portion is reduced, a manufacturing cost of the mounting structure does not increase largely.

Alternatively, the long side of the chip type electric element may be in parallel to the long side of the first land. In this case, the damage of the chip type electric element caused by the distortion of the flexible board is effectively reduced.

Alternatively, the another electric element may further include a second lead terminal. The flexible board further includes a second land, on which the second lead terminal is soldered. The long side of the first land is perpendicular to a long side of the second land. The chip type electric element further has a short side. A whole of the short side of the chip type electric element faces the long side of the second land. A length of the long side of the second land is defined as IC, and a distance between one long side of the second land and one short side of the chip type electric element is defined as ID, the one long side of the second land facing the one short side of the chip type electric element. The length of IC is equal to or larger than the distance of ID. In this case, the influence of the distortion of the board to the chip type electric element and the solder portion is much reduced. Accordingly, the damage of the chip type electric element caused by the distortion of the flexible board is sufficiently reduced.

Alternatively, the chip type electric element may be a multi-layered ceramic capacitor for removing an electromagnetic noise. In this case, since a slight distortion of the flexible board may easily generate a crack in the ceramic capacitor, with using the mounting structure according to the above feature, the crack in the ceramic capacitor caused by the distortion of the board is effectively prevented.

Alternatively, the another electric element may be a Hall IC for detecting a magnetic flux of a magnetic field, and the flexible board is a part of a rotational angle detection device for detecting a rotational angle of a rotation body based on an output signal from the Hall IC.

Alternatively, the second lead terminal may extend straight from a body of the another electric element toward the second land. The first lead terminal extends from the body of the another electric element, and bends at a middle of the first lead terminal so that a bent portion of the first lead terminal is perpendicular to the second lead terminal. The short side of the chip type electric element is in parallel to the long side of the second land and the second lead terminal, and the long side of the chip type electric element is in parallel to the long side of the first land and the bent portion of the first lead terminal.

Further, the bent portion of the first lead terminal and the second lead terminal may provide square space, which is defined in such a manner that the bent portion is one side of the square space, and the second lead terminal is another side of the square space, and the chip type electric element is disposed in the space. Furthermore, the first land may have a rectangular planar shape, and the second land may have a rectangular planar shape. The rectangular planar shape of the first land is equal to the rectangular planar shape of the second land, and the chip type electric element has another rectangular planar shape.

According to a second aspect of the present disclosure, an electric apparatus includes: a flexible board having a first land and a second land; a chip type electric element having a long side and a short side and arranged on a surface of the flexible board; and an electric device having a first lead terminal and a second lead terminal and arranged on the surface of the flexible board. The first lead terminal is soldered on the first land, and the second lead terminal is soldered on the second land. A whole of the long side of the chip type electric element faces a long side of the first land. A length of the long side of the first land is defined as IA, and a distance between one long side of the first land and one long side of the chip type electric element is defined as IB, the one long side of the first land facing the chip type electric element but opposite to the one long side of the chip type electric element. The length of IA is equal to or larger than the distance of IB. The long side of the first land is perpendicular to a long side of the second land. A whole of the short side of the chip type electric element faces the long side of the second land. A length of the long side of the second land is defined as IC, and a distance between one long side of the second land and one short side of the chip type electric element is defined as ID, the one long side of the second land facing the one short side of the chip type electric element. The length of IC is equal to or larger than the distance of ID.

In the above apparatus, with using the rigidity of a solder portion applied to the land, unnecessary load is restricted from being applied to the chip type electric element and the solder portion. Thus, even when a distortion is generated in the flexible board, the distortion of the board does not affect on the chip type electric element and the solder portion or influence of the distortion of the board to the chip type electric element and the solder portion is reduced. Thus, since the load generated by the distortion of the board and applied to the chip type electric element and the solder portion is reduced, damage of the chip type electric element caused by the stress is reduced. Further, since the positional relationship between the land and the chip type electric element is specified so that the load generated by the distortion of the board and applied to the chip type electric element and the solder portion is reduced, a manufacturing cost of the apparatus does not increase largely.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A mounting structure for mounting a chip type electric element on a surface of a flexible board comprising:
   the flexible board having a first land, on which a first lead terminal of another electric element is soldered; and
   the chip type electric element having a long side,
   wherein a whole of the long side of the chip type electric element faces a long side of the first land,
   wherein a length of the long side of the first land is defined as IA, and a distance between one long side of the first land and one long side of the chip type electric element is defined as IB, the one long side of the first land facing the chip type electric element but opposite to the one long side of the chip type electric element, and
   wherein the length of IA is equal to or larger than the distance of IB,
   wherein the another electric element further includes a second lead terminal,
   wherein the flexible board further includes a second land, on which the second lead terminal is soldered,
   wherein the long side of the first land is perpendicular to a long side of the second land,
   wherein the chip type electric element further has a short side,
   wherein a whole of the short side of the chip type electric element faces the long side of the second land
   wherein a length of the long side of the second land is defined as IC, and a distance between one long side of the second land and one short side of the chip type electric element is defined as ID, the one long side of the second land facing the one short side of the chip type electric element, and
   wherein the length of IC is equal to or larger than the distance of ID.

2. The mounting structure according to claim 1, wherein the long side of the chip type electric element is in parallel to the long side of the first land.

3. The mounting structure according to claim 1, wherein the chip type electric element is a multi-layered ceramic capacitor for removing an electro-magnetic noise.

4. The mounting structure according to claim 1, wherein the another electric element is a Hall IC for detecting a magnetic flux of a magnetic field, and
wherein the flexible board is a part of a rotational angle detection device for detecting a rotational angle of a rotation body based on an output signal from the Hall IC.

5. The mounting structure according to claim 1, wherein the second lead terminal extends straight from a body of the another electric element toward the second land,
wherein the first lead terminal extends from the body of the another electric element, and bends at a middle of the first lead terminal so that a bent portion of the first lead terminal is perpendicular to the second lead terminal,
wherein the short side of the chip type electric element is in parallel to the long side of the second land and the second lead terminal, and
wherein the long side of the chip type electric element is in parallel to the long side of the first land and the bent portion of the first lead terminal.

6. The mounting structure according to claim 5,
wherein the bent portion of the first lead terminal and the second lead terminal provide square space, which is defined in such a manner that the bent portion is one side of the square space, and the second lead terminal is another side of the square space, and
wherein the chip type electric element is disposed in the space.

7. The mounting structure according to claim 6,
wherein the first land has a rectangular planar shape, and the second land has a rectangular planar shape,
wherein the rectangular planar shape of the first land is equal to the rectangular planar shape of the second land, and
wherein the chip type electric element has another rectangular planar shape.

8. An electric apparatus comprising:
a flexible board having a first land and a second land;
a chip type electric element having a long side and a short side and arranged on a surface of the flexible board; and
an electric device having a first lead terminal and a second lead terminal and arranged on the surface of the flexible board,
wherein the first lead terminal is soldered on the first land, and the second lead terminal is soldered on the second land,
wherein a whole of the long side of the chip type electric element faces a long side of the first land,
wherein a length of the long side of the first land is defined as IA, and a distance between one long side of the first land and one long side of the chip type electric element is defined as IB, the one long side of the first land facing the chip type electric element but opposite to the one long side of the chip type electric element,
wherein the length of IA is equal to or larger than the distance of IB,
wherein the long side of the first land is perpendicular to a long side of the second land,
wherein a whole of the short side of the chip type electric element faces the long side of the second land,
wherein a length of the long side of the second land is defined as IC, and a distance between one long side of the second land and one short side of the chip type electric element is defined as ID, the one long side of the second land facing the one short side of the chip type electric element, and
wherein the length of IC is equal to or larger than the distance of ID.

* * * * *